United States Patent
Shoji

(10) Patent No.: US 11,996,703 B2
(45) Date of Patent: May 28, 2024

(54) WIRELESS DEVICE

(71) Applicant: CANON KABUSHIKI KAISHA, Tokyo (JP)

(72) Inventor: Yuki Shoji, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 141 days.

(21) Appl. No.: 17/191,124

(22) Filed: Mar. 3, 2021

(65) Prior Publication Data

US 2021/0281111 A1 Sep. 9, 2021

(30) Foreign Application Priority Data

Mar. 6, 2020 (JP) ................................. 2020-039029

(51) Int. Cl.
| | |
|---|---|
| H02P 23/06 | (2016.01) |
| H02J 50/12 | (2016.01) |
| H02M 1/08 | (2006.01) |
| H02P 7/03 | (2016.01) |
| H02P 29/68 | (2016.01) |
| H03L 7/08 | (2006.01) |

(52) U.S. Cl.
CPC ............. *H02J 50/12* (2016.02); *H02M 1/083* (2013.01); *H02P 7/04* (2016.02); *H03L 7/08* (2013.01)

(58) Field of Classification Search
CPC ............. H02M 1/08; H02M 7/10; H02M 7/64
See application file for complete search history.

(56) References Cited

U.S. PATENT DOCUMENTS

| | | | | |
|---|---|---|---|---|
| 2011/0254377 | A1* | 10/2011 | Wildmer | H02J 50/10 307/104 |
| 2017/0008385 | A1* | 1/2017 | Fujimoto | H02K 7/14 |
| 2017/0098959 | A1* | 4/2017 | Kikuchi | H02M 7/04 |

FOREIGN PATENT DOCUMENTS

| | | |
|---|---|---|
| JP | 2012110123 A | 6/2012 |
| JP | 2014075940 A | 4/2014 |
| JP | 2015208150 A | 11/2015 |

\* cited by examiner

*Primary Examiner* — Kawing Chan
*Assistant Examiner* — Charles S Laughlin
(74) *Attorney, Agent, or Firm* — Canon U.S.A., Inc. IP Division

(57) ABSTRACT

A wireless device includes a power transmission coil configured to transmit power wirelessly, a power reception coil configured to receive the power wirelessly, a switch circuit configured to apply a voltage to the power transmission coil based on a first switching signal, and a rectification circuit configured to rectify a voltage output from the power reception coil based on a second switching signal and apply the rectified voltage to a load, wherein the switch circuit and the rectification circuit each include a plurality of bidirectional switches.

14 Claims, 8 Drawing Sheets

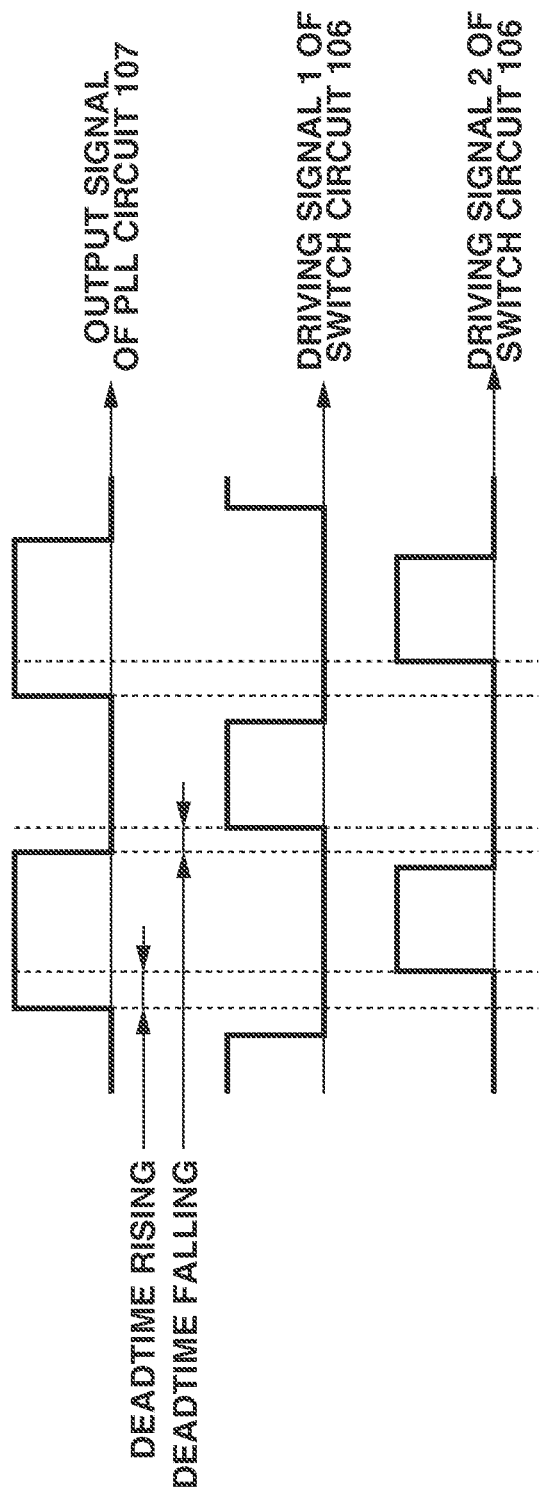

WIRELESS DEVICE

BACKGROUND

Field

The present disclosure relates to wireless devices.

Description of the Related Art

There are systems that feed power to motors to drive the motors. For example, in a semiconductor exposure apparatus, a motor for finely moving a wafer to form a pattern on the wafer is mounted on a stage for moving the wafer to an exposure position, and a power feeding cable for feeding power to drive the motor is connected to the stage. The cable is moved as the stage is moved, so that the tension of the cable affects stage positioning accuracy. Thus, wireless transmission of power for motor driving has been discussed.

United States Patent Application Publication No. 2017/0008385 discusses a configuration of a motor that wirelessly drives wheels. To drive a motor wirelessly, not only power but also control signals of a motor driving circuit and a rectification circuit need to be transmitted wirelessly. Thus, wireless communication using radio waves is performed. The control signals are transmitted to the motor driving circuit provided on the movable side via the communication, thereby controlling the motor driving circuit.

In recent years, there are demands for controlling a voltage applied to a load unit, such as a motor, with a high degree of accuracy. For example, to move a stage at high speed with high accuracy in a semiconductor exposure apparatus, high-speed motor control is required. With the method discussed in United States Patent Application Publication No. 2017/0008385, however, it is difficult to increase the speed of motor control by transmitting control signals to the motor driving circuit at a period of several hundred microseconds (μs) or less because a delay of several hundred μs to several milliseconds (ms) occur in the wireless communication using radio waves.

SUMMARY

Various embodiments of the present disclosure are directed to a technique that increases accuracy in voltage application to loads based on wirelessly-transmitted power.

According to various embodiments, a wireless device includes a power transmission coil configured to transmit power wirelessly, a power reception coil configured to receive the power wirelessly from the power transmission coil, a switch circuit configured to apply a voltage to the power transmission coil based on a first switching signal, and a rectification circuit configured to rectify a voltage output from the power reception coil based on a second switching signal and apply the rectified voltage to a load, wherein the switch circuit and the rectification circuit each include a plurality of bidirectional switches.

Further features of the present disclosure will become apparent from the following description of exemplary embodiments with reference to the attached drawings.

BRIEF DESCRIPTION OF THE DRAWINGS

FIG. 8 illustrates an output signal of a phase locked loop (PLL) circuit and driving signals of a switch circuit.

DESCRIPTION OF THE EMBODIMENTS

Figure 1:
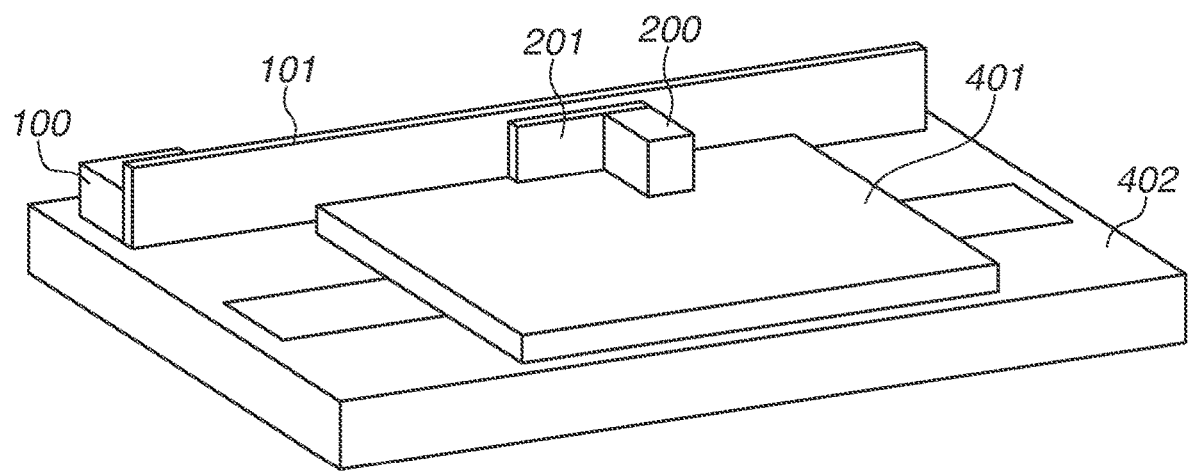
FIG. 1 is a system configuration diagram illustrating a case where a wireless device is applied to a movable stage.

FIG. 1 illustrates an example of a configuration of a wireless device applied to a movable stage in an apparatus, such as a semiconductor exposure apparatus, according to a first exemplary embodiment. The wireless device includes a power transmission unit 100, a power reception unit 200, a power transmission coil 101, and a power reception coil 201.

The power reception unit 200 is placed on a movable stage 401 and is physically moved with respect to the power transmission unit 100. The power transmission unit 100 is placed not on the movable stage 401 but on a fixed side where a movable stage power source 402 that moves the movable stage 401 is provided. The power transmission unit 100 is not moved.

The power transmission coil 101 and the power reception coil 201 for wireless power feeding and communication are provided between the power transmission unit 100 and the power reception unit 200. The power transmission coil 101 and the power reception coil 201 are not in contact with each other. The power reception coil 201 is also placed on the movable stage 401 and is moved together with the movable stage 401. The power transmission coil 101 is elongated to cover a movable range of the movable stage 401 so that power is fed to a motor in the power reception unit 200 in a contactless manner regardless of a position to which the movable stage 401 is moved.

The power transmission coil 101 is, for example, a horizontally-long, elliptic coil, and the power reception coil 201 is a coil that is shorter in length than the power transmission coil 101. Alternatively, the power reception coil 201 can have a longer length, and the power transmission coil 101 can have a shorter length.

Figure 2:
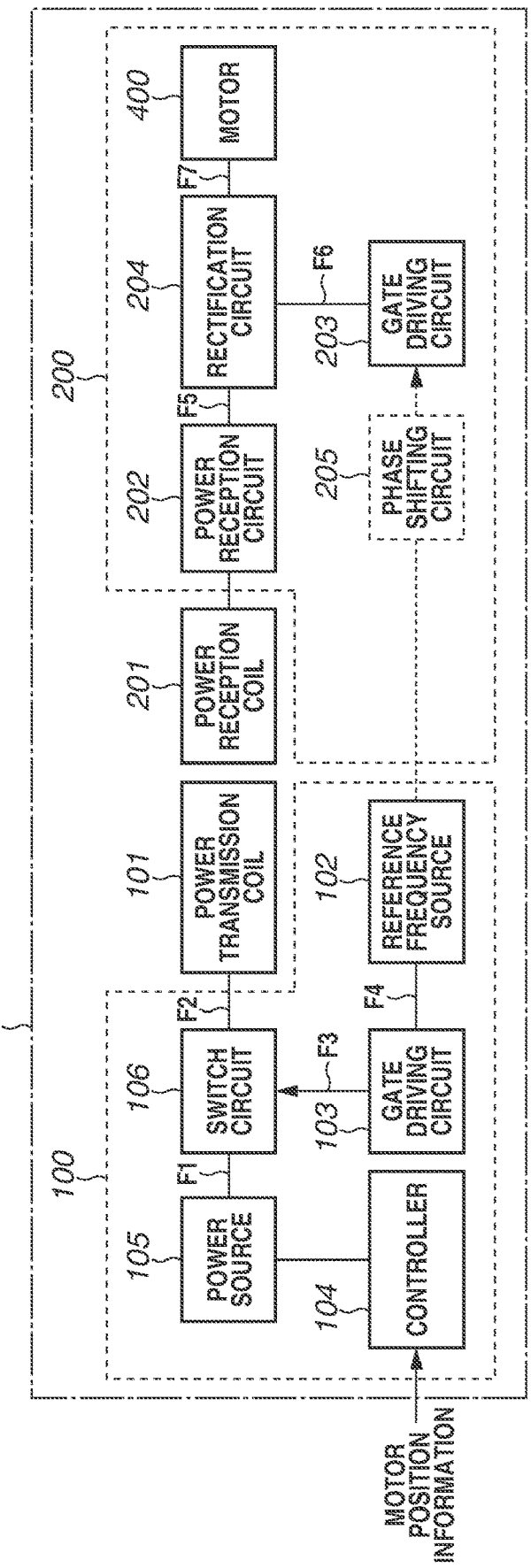
FIG. 2 illustrates an example of a configuration of a wireless device.

FIG. 2 is a block diagram illustrating an example of a configuration of a wireless device 300 according to the first exemplary embodiment. The wireless device 300 includes the power transmission unit 100, the power reception unit 200, the power transmission coil 101, and the power reception coil 201. The power transmission coil 101 and the power reception coil 201 are physically not connected, and power is transmitted in a contactless manner from the power transmission coil 101 to the power reception coil 201. The power transmission unit 100 and the power reception unit 200 are physically not connected, either.

The power transmission unit 100 includes a reference frequency source 102, a gate driving circuit 103, a controller 104, a power source 105, and a switch circuit 106. The power reception unit 200 includes a power reception circuit 202, a gate driving circuit 203, a rectification circuit 204, and a motor 400. The power reception unit 200 can but does not have to include a phase shifting circuit 205.

The power source 105 is a power source that feeds power for driving the motor 400. The switch circuit 106 drives a switching element with a switching control signal using a reference frequency signal as a reference. The switching control signal is generated by the gate driving circuit 103, and the reference frequency signal is generated by the reference frequency source 102. The switch circuit 106 performs high-frequency switching on the power fed from the power source 105 to convert the power to wirelessly-transmittable high-frequency power. At this time, a switching frequency is higher than a period of instruction signals of the controller 104, i.e., motor control frequency.

The controller 104 issues an instruction of a next position based on current position information about the motor 400 that is acquired from an optical sensor. Specifically, the controller 104 outputs an output voltage amplitude value of the power source 105 and motor application voltage sign information. The output voltage amplitude value determines a thrust force of the motor 400, and the motor application voltage sign information determines a moving direction of the motor 400. The controller 104 transmits an instruction signal to the power source 105 so that the power source 105 changes the output voltage amplitude value and an output voltage sign to the instructed values. The reference frequency source 102 outputs the reference frequency signal to the gate driving circuit 103. The gate driving circuit 103 outputs a first switching signal that is frequency-synchronized with the reference frequency signal based on the reference frequency signal to the switch circuit 106.

The switch circuit 106 applies a transmission voltage containing necessary information for motor control to the power transmission coil 101 based on the first switching signal (voltage F3). The power transmission coil 101 wirelessly transmits power. The power reception coil 201, which is not in contact with but is electromagnetically coupled to the power transmission coil 101, is excited by an electromagnetic field of the power transmission coil 101 and generates high-frequency power. The power reception coil 201 wirelessly receives the power from the power transmission coil 101.

The power reception circuit 202 is provided between the power reception coil 201 and the rectification circuit 204. The power reception circuit 202 is formed by a resonance circuit including an inductor and a capacitor, and the resonance frequency is substantially equal to a switching operation frequency of the switch circuit 106. An output terminal of the power reception circuit 202 is connected to the rectification circuit 204.

The rectification circuit 204 rectifies an output voltage of the power reception circuit 202 based on a second switching signal (voltage F6) input from the gate driving circuit 203 and applies the rectified voltage to the motor 400. The second switching signal is a signal that is frequency-synchronized with the reference frequency source 102. The reference frequency source 102 wirelessly transmits the reference frequency signal to the gate driving circuit 203. The gate driving circuit 203 outputs the second switching signal to the rectification circuit 204 based on the reference frequency signal of the reference frequency source 102. The first switching signal (voltage F3) and the second switching signal (voltage F6) have the same frequency but can be different in phase. Specifically, the phase shifting circuit 205 can be provided between the reference frequency source 102 and the gate driving circuit 203. The phase shifting circuit 205 shifts the phase of the reference frequency signal of the reference frequency source 102. The gate driving circuit 203 outputs the second switching signal to the rectification circuit 204 based on the reference frequency signal that is phase-shifted by the phase shifting circuit 205. In this case, an output voltage (power) of the rectification circuit 204 is controlled based on a phase shifting amount of the phase shifting circuit 205. The motor 400 is a load and is rotated or vibrated by the output voltage of the rectification circuit 204.

The reference frequency source 102 transmits the reference frequency signal to the gate driving circuit 203 in a contactless manner via electromagnetic field coupling communication or optical coupling communication. In a case where electromagnetic field coupling communication is used, for example, a transmission electrode (transmission coupler) of the power transmission unit 100 and a reception electrode (reception coupler) of the power reception unit 200 are provided near each other to face each other, and wireless signals are transmitted based on the electromagnetic field coupling between the electrodes. The electromagnetic field coupling in the present exemplary embodiment includes both electric field coupling and magnetic field coupling. Specifically, contactless signal transmission can be performed based on electric field coupling or magnetic field coupling or both. In a case where optical coupling communication is used, for example, a laser or a sharply-directed light emitting diode is provided at the reference frequency source 102 on the fixed side and caused to emit light along a moving direction of the stage 401, and a light receiving element, such as a photodiode, is provided at the power reception unit 200 on the movable side so that a light receiving surface is on an optical path of the emitted light.

Further, the rectification circuit 204 is configured to perform synchronization rectification using an active switching element so that small voltages of several millivolts (mV) that cannot be rectified by diodes can be rectified and a significantly small voltage can be applied to the motor 400. Thus, the motor 400 is controlled with great accuracy.

The power transmission coil 101 and the power reception coil 201 can be formed by wires of a printed-circuit board. A magnetic sheet can be attached to the printed-circuit board to reduce loss in magnetic field coupling. Further, the power transmission coil 101 and the power reception coil 201 can be a wire-wound transformer using a magnetic member, such as ferrite, and winding wires, such as litz wires.

Next, an operating principle of the wireless device 300 will be described below from a mathematical point of view. Voltages F1 to F7 in FIG. 2 are each expressed by a function of a voltage waveform of each component. The voltage F1 is an output voltage of the power source 105 and is the absolute value of a voltage necessary for driving a motor. The voltage F1 is expressed by Equation (1).

$$F1 = A \tag{1}$$

The voltage F4 is an output voltage of the reference frequency source 102 and is expressed by Equation (2). The voltage F4 can use a rectangular wave.

$$F4 = \cos \omega t \tag{2}$$

The voltage F3 is a control signal of the switch circuit 106 that is output from the gate driving circuit 103 to the switch circuit 106, and the voltage F3 is expressed by Equation (3). In Equation (3), φ is a phase difference that is generated due to a propagation delay of the gate driving circuit 103.

$$F3 = \cos(\omega t - \varphi) \tag{3}$$

The switch circuit 106 can be considered as a multiplier that multiplies the voltages F1 and F3 on a temporal axis, and the output voltage F2 of the switch circuit 106 is given by Equation (4).

$$F2 = F1 \cdot F3 = A \cdot \cos(\omega t - \varphi) \tag{4}$$

The voltage F2 is propagated from the power transmission coil 101 to the power reception coil 201 via electromagnetic field coupling, and the power reception circuit 202 performs power factor regulation on the propagated voltage. Then, the resultant voltage is input to the rectification circuit 204. For convenience, it is assumed that the power transmission coil 101 and the power reception coil 201 are ideally coupled at the voltage ratio of 1:1 in the present exemplary embodiment. The input voltage F5 of the rectification circuit 204 is given by Equation (5).

$$F5 = A \cdot \cos(\omega t - \varphi - \theta) \quad (5)$$

In Equation 5, θ is the sum of delays in propagation from the switch circuit 106 to a portion immediately before the rectification circuit 204 and phase differences due to resonance shifts of the power reception circuit 202. The voltage F6 is a driving signal of the rectification circuit 204 that is output from the gate driving circuit 203 to the rectification circuit 204 and is expressed by Equation (6). In Equation (6), a phase difference δ is a phase difference that is generated due to propagation delays of the gate driving circuit 203. The voltages F3 and F6 have the same period.

$$F6 = \cos(\omega t - \delta) \quad (6)$$

The rectification circuit 204 can be considered as a multiplier, like the switch circuit 106, so that the output voltage F7 of the rectification circuit 204 is given by Equation (7).

$$F7 = F5 * F6 = A \cdot \cos(\omega t - \varphi - \theta)\cos(\omega t - \delta) \quad (7)$$
$$= \frac{1}{2}A\{\cos(2\omega t - \varphi - \theta - \delta) + \cos(-\varphi - \theta + \delta)\}$$

The first term of Equation (7) indicates a harmonic component generated by multiplication. A smoothing capacitor that exhibits a sufficiently low impedance with respect to a power transmission frequency is mounted on an output portion of the rectification circuit 204, so that the harmonic component is attenuated to an ignorable level. As a result, a driving voltage of the motor 400 is expressed by the second term. Thus, the driving voltage F7 of the motor 400 is given by Equation (8).

$$F7 \approx \frac{1}{2}A \cdot \cos(-\varphi - \theta + \delta) \quad (8)$$

Equation 8 indicates that the motor driving voltage F7 is sinusoidally controllable based on the phase difference between the second switching signal (voltage F6) input to the rectification circuit 204 and the output voltage F5 of the power reception circuit 202. A maximum value in Equation 8 is read to be ½ of the output voltage F1 of the power source 105, but this is a result in a case where the switch circuit 106 is sinusoidally driven. In a case where, for example, the switch circuit 106 is assumed to be driven by an ideal rectangular wave with a duty ratio of 50%, the maximum value in Equation 8 is equal to the output voltage F1 of the power source 105. Thus, the motor driving voltage F7' of the power source 105 in this case is rewritten into Equation (9).

$$F7' \approx A \cdot \cos(-\varphi - \theta + \delta) \quad (9)$$

The operations of the wireless device 300 are mathematically expressed in a simplified manner as described above.

A specific example of the control of the motor 400 will be described below. The phase shifting amount a of the phase shifting circuit 205 is adjusted to absorb the sum $(-\varphi-\theta+\delta)$ of the phase difference δ generated due to propagation delays of the gate driving circuit 203 and the phase difference $(-\varphi-\theta)$ between the second switching signal (voltage F6) input to the rectification circuit 204 and the output voltage F5 of the power reception circuit 202. At this time, the motor driving voltage F7' is given by Equation (10). The phase shifting amount a is adjusted so that $(-\varphi-\theta+\delta+\alpha)$ equals zero. This indicates that the output voltage F1 of the power source 105 is transmitted in a contactless manner via the power transmission coil 101 and the power reception coil 201 and is reproduced as the motor driving voltage F7'. The motor driving voltage F7' equals the output voltage F1 of the power source 105.

$$F7' \approx A \cdot \cos(-\varphi - \theta + \delta + \alpha) = A \cdot \cos 0 = A \quad (10)$$

From Equation 10, it is understood that the motor control is realized by switching the value and sign of the output voltage F1 of the power source 105.

In other words, the thrust force and forward and reverse rotations of the motor 400 are controlled in a contactless manner if the output voltage F4 of the reference frequency source 102 and the voltages F3 and F6 are frequency-synchronized and the phase shifting amount a of the phase shifting circuit 205 is set as appropriate. According to the present exemplary embodiment, a mechanism for contactlessly transmitting motor control signals to the outside of the wireless device 300 via radio wave communication is not needed. Conventional motor control signals are pulse width modulation (PWM) signals. To contactlessly transmit necessary information for realizing high-speed PWM driving with high accuracy and with low delay, a system for the transmission becomes complicated, and this becomes a main factor that limits the upper limit of high speed control. In order to drive the motor 400 with high accuracy, the change in the motor driving voltage F7' with respect to the output voltage F1 of the power source 105 desirably have a proportional relationship at a constant ratio regardless of the voltage values. In a case where there is a condition that breaks the proportional relationship due to some factor, the proportional relationship can be improved by finely adjusting the phase shifting amount a by the phase shifting circuit 205.

Figure 3:
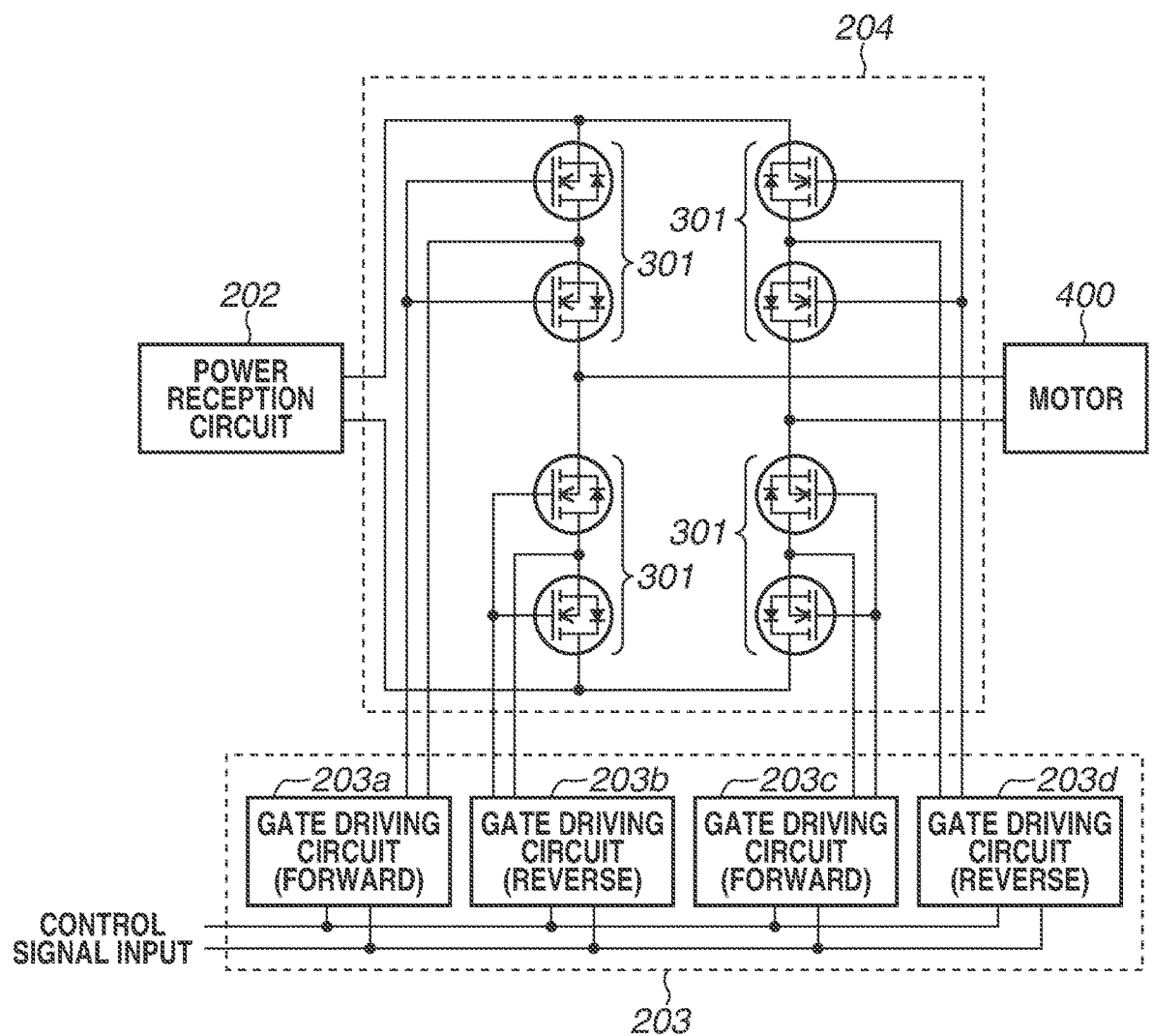
FIG. 3 illustrates an example of a configuration of a rectification circuit.

FIG. 3 illustrates an example of a configuration of the rectification circuit 204. The gate driving circuit 203 includes four gate driving circuits 203a to 203d. A conventional synchronization rectification circuit is realized by using four switching elements, but in this configuration, rectification signals that change in both positive and negative directions cannot be output. This is because there are a body diode and a parasitic element equivalent to the body diode in each switching element and if a reverse bias is applied between a drain and a source of a transistor, it causes a conductive state between the drain and the source regardless of the driving state of a gate. Thus, the rectification circuit 204 includes a plurality of bidirectional switches 301 including two switching elements with respect to each of the gate driving circuits 203a to 203d. With this configuration, the switching elements do not become conductive unless the gate driving circuits 203a to 203d perform ON-control, so that rectification signals that change in both positive and negative directions can be output. A driving power source between the source and the gate is realized by feeding a voltage from a floating power source that includes an insulation power source and is capable of feeding a voltage of about 5 V to 10 V using a potential of each source terminal as a reference. Each bidirectional switch 301 of the rectification circuit 204 is driven by the second switching signal based on the potential of the source terminal of the bidirectional switch 301 as a reference.

Next, operations of the rectification circuit 204 will be described below. Basically, functional requirements can be achieved regardless of whether the output voltage of the rectification circuit 204 is high or low, or positive or negative if the gate driving circuit 203 controls each bidirectional switch 301 with the same frequency as the reference frequency source 102. Specifically, with the same frequency as the reference frequency source 102, the upper left and the lower right of the four bidirectional switches 301 of the rectification circuit 204 are changed to an on-state and the lower left and the upper right are changed to an off-state during a half period, and the opposite operations are performed during the next half period. If the phase shifting amount a of the phase shifting circuit 205 changes while the operations are repeated, the rectification output voltage F7' corresponding to the phase shifting amount a is acquired as described above.

In this gate driving sequence, if, for example, the upper-right and lower-right bidirectional switches 301 are simultaneously changed to an on-state, a through current flows, and a significant loss occurs. In some cases, the loss may damage the bidirectional switches 301, so that this is undesirable. Thus, a dead time needs to be inserted to gate driving signals at switching timings of the bidirectional switches 301 to avoid the through current. The dead time for preventing the through current is provided to the driving signals of the plurality of bidirectional switches 301. The insertion of the dead time does not affect the frequency synchronization and thus does not hinder the rectification operation. While the description has been given of the full-bridge rectification circuit 204 above, the rectification circuit 204 can be a center-tapped rectification circuit. In this case, the power reception coil 201 needs to be a center-tapped power reception coil, and the wiring becomes complex thereby, but it is possible to reduce the number of switching elements of the rectification circuit 204 to four.

It is significantly advantageous that the rectification circuit 204 capable of outputting positive and negative voltages can be realized with such a simple circuit configuration in terms of size reduction of the wireless device 300. Furthermore, driving the rectification circuit 204 with control signals that are frequency-synchronized with the reference frequency source 102 is the only condition necessary for satisfying the functional requirements of the rectification circuit 204, so that it can be realized relatively with ease. On the contrary, conventional motor control signals are PWM signals. To contactlessly transmit necessary information for realizing high-speed PWM driving with high accuracy and with low delay, a system for the transmission becomes complicated, and this becomes a main factor that limits the upper limit of high speed control.

Figure 4:
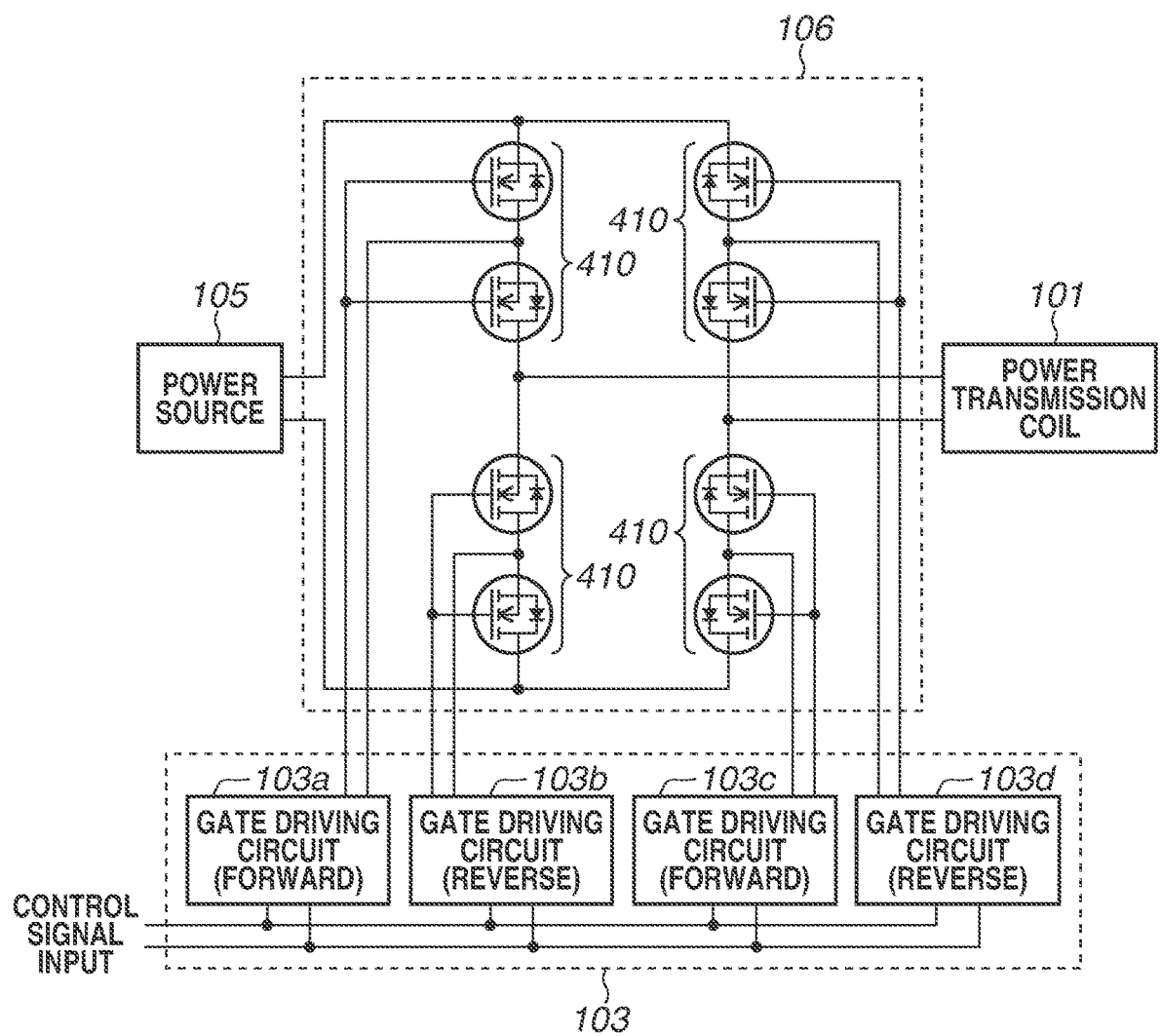
FIG. 4 illustrates an example of a configuration of a switch circuit.

FIG. 4 illustrates an example of a configuration of the switch circuit 106. The gate driving circuit 103 includes four gate driving circuits 103a to 103d. A conventional switch circuit is realized by using four switching elements, but with this configuration, the power source 105 that changes the output voltage in both positive and negative directions cannot be connected. This is because there are a body diode and an parasitic element equivalent to the body diode in each switching element and if a reverse bias is applied between a drain and a source of a transistor, it causes a conductive state between the drain and the source regardless of the driving state of a gate. Thus, the switch circuit 106 includes a plurality of bidirectional switches 410 including two switching elements with respect to each of the gate driving circuits 103a to 103d. With this configuration, the switching elements do not become conductive unless the gate driving circuits 103a to 103d perform ON-control, so that the output voltage F1 of the power source 105 that changes in both positive and negative directions can be switched and the switched voltage can be transmitted as high-frequency power to the power transmission coil 101. A driving power source between the source and the gate is realized by feeding a voltage from a floating power source that includes an insulation power source and is capable of feeding a voltage of about 5 V to 10 V using a potential of each source terminal as a reference. Each bidirectional switch 410 of the switch circuit 106 is driven by the first switching signal based on the potential of the source terminal of the bidirectional switch 410 as a reference.

Next, operations of the switch circuit 106 will be described below. Basically, functional requirements can be achieved regardless of whether the output voltage F1 of the power source 105 is high or low, or positive or negative if the gate driving circuit 103 controls each bidirectional switch 410 with the same frequency as the reference frequency source 102. Specifically, with the same frequency as the reference frequency source 102, the upper left and the lower right of the four bidirectional switches 410 of the switch circuit 106 are changed to an on-state and the lower left and the upper right are changed to an off-state during a half period, and the opposite operations are performed during the next half period.

In this gate driving sequence, if, for example, the upper-right and lower-right bidirectional switches 410 are simultaneously changed to an on-state, a through current flows, which generates a significant loss. In some cases, the loss may damage the bidirectional switches 410, so that this is undesirable. Thus, a dead time needs to be inserted to gate driving signals at switching timings of the bidirectional switches 410 to avoid the through current. The dead time for preventing the through current is provided to the driving signals of the plurality of bidirectional switches 410. The insertion of the dead time does not affect the frequency synchronization and thus does not hinder the switching operation. While the description has been given of the full-bridge switch circuit 106 above, the switch circuit 106 can be a center-tapped switch circuit. In this case, the power transmission coil 101 needs to be a center-tapped power transmission coil, and the wiring becomes complex thereby, but it is possible to reduce the number of switching elements of the switch circuit 106 to four.

It is significantly advantageous, in terms of size reduction of the wireless device 300, that wireless power transmission can be realized with such a simple circuit configuration by switching the output voltage F1 of the power source 105 that changes in positive and negative directions. Furthermore, driving the switch circuit 106 with control signals that are frequency-synchronized with the reference frequency source 102 is the only condition necessary for satisfying the functional requirements of the switch circuit 106, so that it can be realized relatively with ease. On the contrary, conventional motor control signals are PWM signals. To contactlessly transmit necessary information for realizing high-speed PWM driving with high accuracy and with low delay, a system for the transmission becomes complicated, and this becomes a main factor that limits the upper limit of high speed control.

Figure 5:
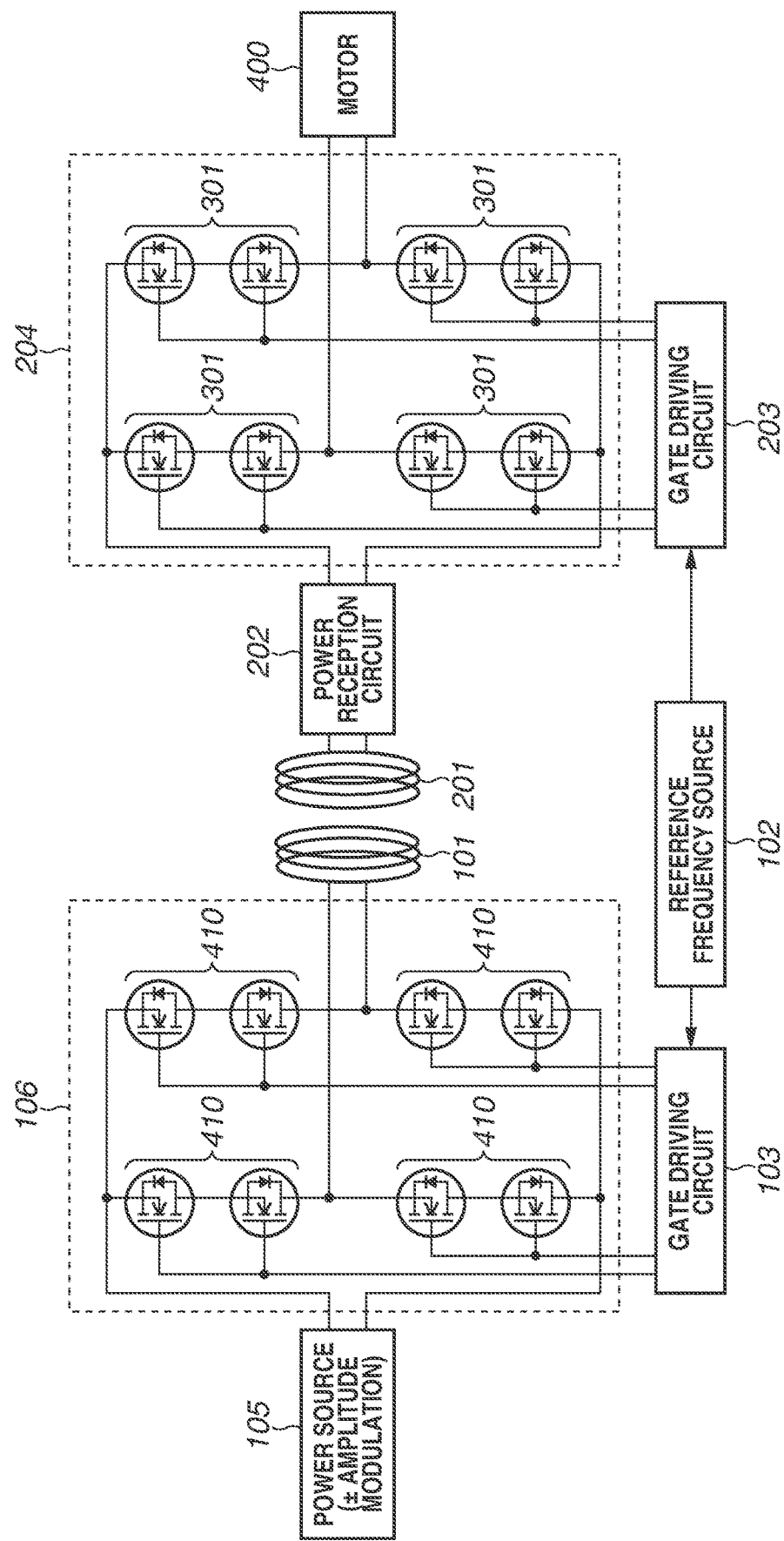
FIG. 5 illustrates an example of a configuration of a wireless device.

FIG. 5 illustrates a specific example of a configuration of the wireless device 300 that includes the switch circuit 106 including the plurality of bidirectional switches 410 and the rectification circuit 204 including the plurality of bidirectional switches 301. In the present exemplary embodiment, metal oxide semiconductor field-effect transistors (MOSFETs) are used as the switching elements of the bidirectional switches 301 and 410. Alternatively the switching elements can be bipolar transistors, gallium nitride field-effect transistors (GaNFETs), insulated gate bipolar transistors (IGBT), or silicon carbide (SiC) transistors. While the switch circuit 106 and the power transmission coil 101 are directly connected in FIG. 5 for convenience of description, a resonance circuit including an inductor or a capacitor or both can be inserted between the switch circuit 106 and the power transmission coil 101.

The structures of the switch circuit 106 and the rectification circuit 204 are equivalent to each other, and the switching operations of the switch circuit 106 and the rectification circuit 204 are respectively continued based on driving signals of the gate driving circuit 103 and the gate driving circuit 203 regardless of the direction in which a current flows or a voltage is applied. Thus, the power reception coil 201 wirelessly transmits a back electromotive force (regenerative power) generated by the motor 400 to the power transmission coil 101. This is significantly advantageous from the point of view of preventing generation of a high-voltage surge. The wireless device 300 can be designed so that power is intentionally transmitted back from the power reception unit 200 to the power transmission unit 100. The power transmission unit 100 and the power reception unit 200 that each include an independent power source device (e.g., battery) can be useful means in a case of transmitting power bidirectionally.

Figure 6:
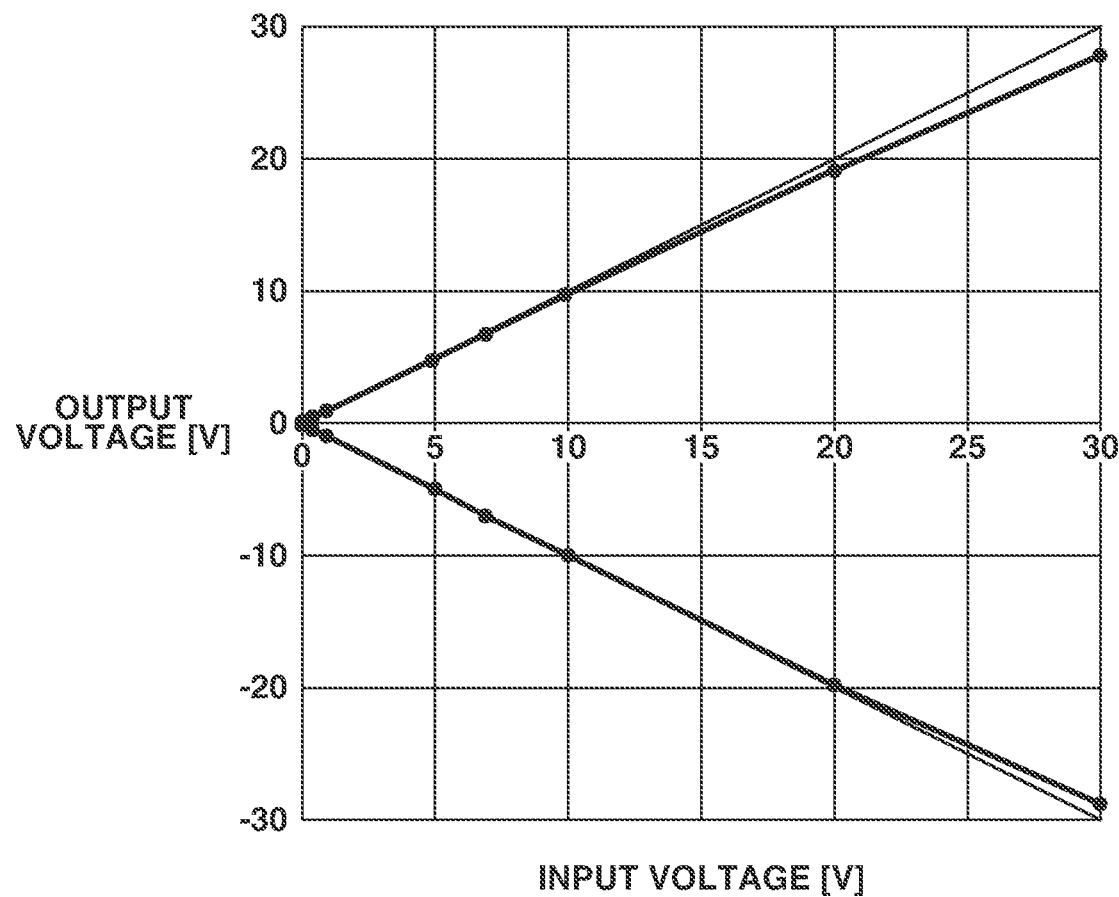
FIG. 6 illustrates an example of measured input/output voltages.

FIG. 6 illustrates input and output voltage measurement results acquired by measuring an application voltage to the motor 400 with respect to the output voltage F1 of the power source 105. The horizontal axis presents the output voltage F1 of the power source 105, i.e., input voltage. The vertical axis presents the application voltage to the motor 400, i.e., output voltage. In FIG. 6, an ideal curve representing a case where the input/output voltages match is also illustrated. The switching frequency is 4 MHz, and a 3 mH inductor is connected as a dummy load in place of the motor 400. An arbitrary voltage from 0 V to 30 V is wirelessly fed. In some areas, the output voltage is lower than the ideal curve. The output voltage in the areas can be brought close to the ideal curve by correcting an output voltage amplitude instruction value issued by the controller 104 to the power source 105 to increase the output voltage F1 of the power source 105 by the amount of voltage drop or by adjusting the phase shifting amount by the phase shifting circuit 205 based on the measurement results in FIG. 6. The results show the usefulness of the wireless device 300.

The wireless device 300 realizes high speed motor control and reduction in size and weight of a circuit on a movable side of a motor driving circuit that wirelessly feeds power.

In a second exemplary embodiment, the wireless device 300 that satisfies the operating principle in the first exemplary embodiment while setting a switching frequency for use in wireless power transmission and a frequency of the reference frequency source 102 as desired will be described below.

Figure 7:
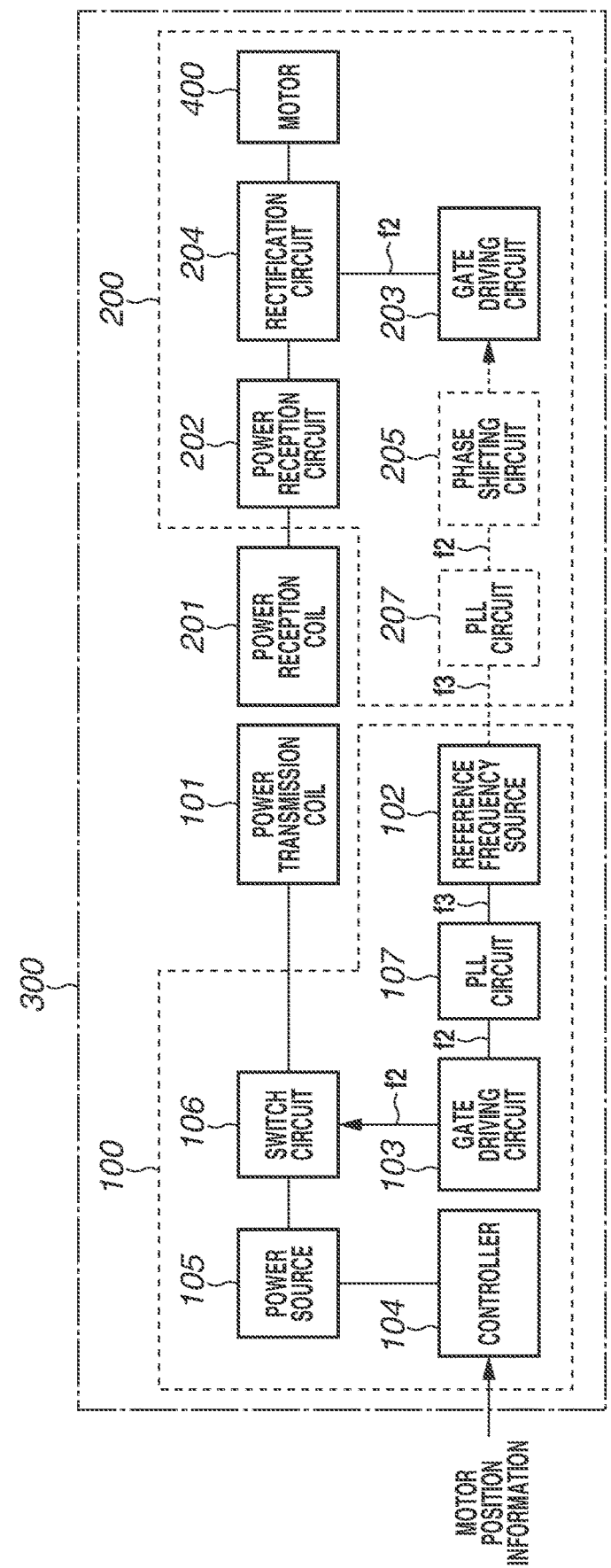
FIG. 7 illustrates an example of a configuration of a wireless device.

FIG. 7 illustrates an example of a configuration of the wireless device 300 according to the second exemplary embodiment. The configuration in FIG. 7 is the same as the configuration in FIG. 2 except for phase locked loop (PLL) circuits 107 and 207 added therein. In FIG. 7, f2 and f3 are signal frequencies at respective components.

The switching frequency for use in wireless power transmission can take various values depending on an antenna shape, transmission power, and input voltage. Further, the switching frequency needs to be adjusted with an accuracy of 10 kHz to 100 kHz. A crystal oscillator or a microelectromechanical system (MEMS) oscillator is used as the reference frequency source 102, but the devices are manufactured to produce discrete frequencies and are not suitable for use in changing output frequencies with meticulous accuracy. To overcome this issue, the PLL circuits 107 and 207 are used.

In the second exemplary embodiment, a crystal oscillator is used as the reference frequency source 102. The PLL circuit 107 in the power transmission unit 100 and the PLL circuit 207 in the power reception unit 200 share output signals of the reference frequency source 102. A common value suitable for wireless power transmission is set to the setting values of the output frequencies f2 of the two PLL circuits 107 and 207 to realize a flexible design suitable for an environment. The output signal of the PLL circuit 207 is input to the phase shifting circuit 205.

The phase shifting circuit 205 is useful in a case where a waveform of the voltage or current received by the power reception unit 200 is acquired and the phase shifting amount a in Equation 10 is detected to adjust the detected phase shifting amount a to a desired value.

The reference frequency source 102 outputs the reference frequency signal to the PLL circuits 107 and 207. The reference frequency signal of the reference frequency source 102 is input to the PLL circuit 107, and the PLL circuit 107 outputs a control signal synchronized with the reference frequency signal to the gate driving circuit 103. The gate driving circuit 103 outputs the first switching signal to the switch circuit 106 based on the control signal output from the PLL circuit 107. The reference frequency signal of the reference frequency source 102 is input to the PLL circuit 207, and the PLL circuit 207 outputs a control signal synchronized with the reference frequency signal. The phase shifting circuit 205 phase-shifts the control signal output from the PLL circuit 207. The gate driving circuit 203 outputs the second switching signal to the rectification circuit 204 based on the control signal that is phase-shifted by the phase shifting circuit 205.

The phase shifting circuit 205 can be omitted. In such a case, the gate driving circuit 203 outputs the second switching signal to the rectification circuit 204 based on the control signal output from the PLL circuit 207.

The phase shifting circuit 205 is realized by an analog circuit including a combination of a capacitor-and-resistor (CR) low-pass filter and a waveform shaping circuit. Alternatively, the phase shifting circuit 205 is realized by changing an output tap position of a shift register driven with a high-speed clock signal. The phase shifting circuit 205 has an issue of jitter of output signals in the case where a shift register is used. Thus, a driving clock signal of the shift register of the phase shifting circuit 205 is desirably sufficiently faster (several 10 MHz to several GHz) than the power transmission frequency or is an integral multiple of the power transmission frequency and phase-synchronized.

As to circuit topologies of the switch circuit 106, a full-bridge, half-bridge, or push-pull switch circuit is employed. For example, in a case where the switch circuit 106 is a half-bridge switch circuit, a dead time needs to be inserted. FIG. 8 illustrates a relationship between the output signal of the PLL circuit 107 and the driving signals to which the dead time is inserted to drive the half-bridge switch circuit 106. As indicated in FIG. 8, since the period of the driving signals of the switch circuit 106 matches the period of the output signal of the PLL circuit 107 even though the dead time is inserted, so that the driving signals of the switch circuit 106 and the rectification circuit 204 can be frequency-synchronized. Constant numbers of the switch circuit 106 can be designed such that a zero current switching (ZCS) or zero voltage switching (ZVS)) operation is performed to increase a power conversion efficiency.

The PLL circuits 107 and 207 and the phase shifting circuit 205 can use built-in functions of known integrated circuits (microcontroller, field-programmable gate array (FPGA)). By use of the built-in functions, it is possible to reduce the number of components used in the wireless device 300, thereby realizing size and cost reduction, and also possible to implement scalability that allows flexible change of parameters using programs.

The PLL circuits 107 and 207 and the phase shifting circuit 205 can include a timer function of a microcontroller or a FPGA. Further, the PLL circuits 107 and 207 and the phase shifting circuit 205 can include a counter logic circuit and a frequency divider circuit.

According to the first and second exemplary embodiments, the wireless device 300 wirelessly feeds power to drive the motor 400. The wireless device 300 does not need control signal transmission using PWM signals, so that the control speed of the motor 400 can be increased, and the size and weight of the circuit on the movable side can be reduced. The wireless device 300 can reduce the effect of a delay in control signal transmission, which is a factor that makes it difficult to achieve high speed control, and increase the control speed of the motor 400.

The above-described exemplary embodiments are mere examples of implementation of the present invention, and the technical scope of the present invention should not be interpreted narrowly based on the exemplary embodiments. Specifically, the present invention can be implemented in various forms without departing from the technical concept or major features of the present disclosure.

According to various embodiments of the present disclosure, it is possible to increase accuracy in application of a voltage to a load based on wirelessly-transmitted power.

While various features have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-039029, filed Mar. 6, 2020, which is hereby incorporated by reference herein in its entirety.

What is claimed is:

1. A wireless device comprising:
   a power transmission coil configured to transmit power wirelessly;
   a power reception coil configured to receive the power wirelessly from the power transmission coil;
   a switch circuit configured to apply a voltage to the power transmission coil based on a first switching signal;
   a rectification circuit configured to rectify a voltage output from the power reception coil based on a second switching signal and apply the rectified voltage to a load;
   a reference frequency source configured to output a reference frequency signal;
   a first driving circuit configured to output the first switching signal to the switch circuit;
   a second driving circuit configured to output the second switching signal to the rectification circuit; and
   a first phase locked loop (first PLL) circuit to which the reference frequency signal is input and that outputs a first signal;
   wherein the switch circuit and the rectification circuit each includes a plurality of bidirectional switches, and
   wherein the first driving circuit outputs the first switching signal to the switch circuit based on the first signal.

2. The wireless device according to claim 1, wherein the first switching signal and the second switching signal have a same period.

3. The wireless device according to claim 1, wherein a dead time is provided to a driving signal of each of the plurality of bidirectional switches to prevent a through current.

4. The wireless device according to claim 1, wherein the switch circuit is a full-bridge, half-bridge, or push-pull switch circuit.

5. The wireless device according to claim 1, wherein the switch circuit performs a zero current switching (ZCS) operation or a zero voltage switching (ZVS) operation.

6. The wireless device according to claim 1, further comprising a resonance circuit between the power reception coil and the rectification circuit.

7. The wireless device according to claim 1, further comprising a resonance circuit between the power transmission coil and the switch circuit.

8. The wireless device according to claim 1, further comprising a phase shifting circuit configured to phase-shift the reference frequency signal,
   wherein the second driving circuit outputs the second switching signal to the rectification circuit based on the reference frequency signal that is phase-shifted by the phase shifting circuit.

9. The wireless device according to claim 1, further comprising:
   a second phase locked loop (second PLL) circuit to which the reference frequency signal is input and that outputs a second signal,
   wherein the second driving circuit outputs the second switching signal to the rectification circuit based on the second signal.

10. The wireless device according to claim 9, further comprising a phase shifting circuit configured to phase-shift the second signal,
    wherein the second driving circuit outputs the second switching signal to the rectification circuit based on the second signal that is phase-shifted by the phase shifting circuit.

11. The wireless device according to claim 1, wherein the second driving circuit outputs the second switching signal to the rectification circuit based on the reference frequency signal that is transmitted from the reference frequency source via electromagnetic field coupling communication or optical coupling communication.

12. The wireless device according to claim 1, wherein the load is a motor.

13. The wireless device according to claim 12, wherein the power reception coil wirelessly transmits a back electromotive force generated by the motor to the power transmission coil.

14. The wireless device according to claim 1,
wherein each bidirectional switch of the switch circuit is driven by the first switching signal based on a potential of a source terminal of the bidirectional switch as a reference, and
wherein each bidirectional switch of the rectification circuit is driven by the second switching signal based on a potential of a source terminal of the bidirectional switch as a reference.

* * * * *